(12) United States Patent
Basker et al.

(10) Patent No.: US 9,147,683 B2
(45) Date of Patent: Sep. 29, 2015

(54) CMOS TRANSISTORS INCLUDING GATE SPACERS OF THE SAME THICKNESS

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Mountain View, CA (US)

(73) Assignee: International Business Machines Corporation, Armonk, NY (US)

( * ) Notice: Subject to any disclaimer, the term of this patent is extended or adjusted under 35 U.S.C. 154(b) by 33 days.

(21) Appl. No.: 14/182,529

(22) Filed: Feb. 18, 2014

(65) Prior Publication Data

US 2015/0236019 A1  Aug. 20, 2015

(51) Int. Cl.
| | |
|---|---|
| *H01L 27/092* | (2006.01) |
| *H01L 21/8238* | (2006.01) |
| *H01L 29/66* | (2006.01) |
| *H01L 21/02* | (2006.01) |
| *H01L 21/3105* | (2006.01) |

(52) U.S. Cl.
CPC ...... *H01L 27/0924* (2013.01); *H01L 21/02164* (2013.01); *H01L 21/31051* (2013.01); *H01L 21/823807* (2013.01); *H01L 21/823821* (2013.01); *H01L 21/823828* (2013.01); *H01L 29/6656* (2013.01)

(58) Field of Classification Search
CPC .................. H01L 21/823864; H01L 29/66636; H01L 29/6656; H01L 27/0922; H01L 29/6653; H01L 21/823857; H01L 27/088; H01L 21/82345; H01L 21/823462; H01L 21/8238; H01L 29/4958; H01L 21/823828; H01L 21/823814; H01L 21/823842
See application file for complete search history.

(56) References Cited

U.S. PATENT DOCUMENTS

| | | | |
|---|---|---|---|
| 5,683,934 A | 11/1997 | Candelaria | |
| 7,151,023 B1 * | 12/2006 | Nayfeh et al. | 438/231 |
| 7,879,675 B2 | 2/2011 | Radosavljevic et al. | |
| 8,216,906 B2 | 7/2012 | Tsai et al. | |
| 8,236,659 B2 | 8/2012 | Tsai et al. | |
| 8,278,196 B2 | 10/2012 | Huang et al. | |
| 8,338,305 B2 * | 12/2012 | Chen et al. | 438/700 |
| 8,404,551 B2 | 3/2013 | Ranade et al. | |
| 8,778,768 B1 * | 7/2014 | Chang et al. | 438/303 |
| 2006/0202266 A1 * | 9/2006 | Radosavljevic et al. | 257/344 |

(Continued)

*Primary Examiner* — Evan Pert
*Assistant Examiner* — Gustavo Ramallo
(74) *Attorney, Agent, or Firm* — Scully, Scott, Murphy & Presser, P.C.; H. Daniel Schnurmann (57) ABSTRACT

A dielectric material layer is deposited on gate structures of first and second semiconductor material portions. The dielectric material layer is anisotropically etched to form a first gate spacer on a first semiconductor material portion, while being protected above the second semiconductor material portion. After formation of first raised active regions on the first semiconductor material portion, a dielectric stack of a dielectric oxide liner and a dielectric nitride liner is formed. The dielectric stack is removed over the second semiconductor material portion and a second gate spacer is formed on the second semiconductor material portion, while the dielectric stack protects the first raised active regions. A second gate spacer is formed by anisotropically etching the dielectric material layer over the second semiconductor material portion. The first and second gate spacers have the same composition and thickness. Second raised active regions can be formed on the second semiconductor material portion.

17 Claims, 12 Drawing Sheets

(56) References Cited

U.S. PATENT DOCUMENTS

| | | | |
|---|---|---|---|
| 2007/0018205 A1* | 1/2007 | Chidambarrao et al. | 257/288 |
| 2008/0079060 A1* | 4/2008 | Zhu | 257/321 |
| 2008/0237726 A1* | 10/2008 | Dyer | 257/369 |
| 2009/0224335 A1* | 9/2009 | Chang et al. | 257/396 |
| 2010/0087055 A1* | 4/2010 | Lai et al. | 438/585 |
| 2012/0261771 A1 | 10/2012 | Vega et al. | |

* cited by examiner

CMOS TRANSISTORS INCLUDING GATE SPACERS OF THE SAME THICKNESS

BACKGROUND

The present disclosure relates to semiconductor structures, and particularly to complementary metal oxide semiconductor (CMOS) field effect transistors (FETs) including gate spacers of the same thickness and a method of manufacturing the same.

A CMOS circuit includes p-type transistors and n-type transistors. If a process integration scheme employing two separate epitaxial deposition processes are employed to form the raised active regions of the p-type transistors and the raised active regions of the n-type transistors, one type of transistors needs to be covered with a dielectric layer while a selective epitaxy process is performed on physically exposed semiconductor surfaces of the other type of transistors. The inherent asymmetry in the dielectric material stack during formation of gate spacers for the two types of transistors results in thicker gate spacers for the type of transistors on which a second selective epitaxy process is performed. The difference in the thicknesses of the gate spacers across the two types of transistors results in a difference in the extension length across the two types of transistors when epitaxial films are used for doping source and drain extension regions, which can adversely impact the device performance. In view of the deleterious effect due to the differences in the thicknesses of the gate spacers of different types of transistors, a scheme for providing the same thickness for the gate spacers of all types of transistors on a same substrate is desired.

SUMMARY

A dielectric material layer is deposited on gate structures of first and second semiconductor material portions to be employed for active regions of a p-type transistor and an n-type transistor. The dielectric material layer is anisotropically etched to form a first gate spacer on a first semiconductor material portion (which can be for p-type transistor or for an n-type transistor), while the dielectric material layer is protected above a second semiconductor material portion. After formation of first raised active regions on the first semiconductor material portion, a dielectric stack of a dielectric oxide liner and a dielectric nitride liner is formed on the first semiconductor material portion and the remaining portion of the dielectric material layer. The dielectric stack is removed over the second semiconductor material portion and a second gate spacer is formed on the second semiconductor material portion, while the dielectric stack protects the first raised active regions. A second gate spacer is formed by anisotropically etching the dielectric material layer over the second semiconductor material portion. The first and second gate spacers have the same composition and the same thickness. Second raised active regions can be formed on the second semiconductor material portion.

According to an aspect of the present disclosure, a method of forming a semiconductor structure is provided. A first gate structure straddling a first semiconductor material portion in a first device region and a second gate structure straddling a second semiconductor material portion in a second device region are formed on a substrate. A dielectric material layer is formed on the first and second gate structures. A first gate spacer is formed by anisotropically etching a first portion of the dielectric material layer in the first device region while a second portion of the dielectric material layer is masked in the second device region. A dielectric stack including dielectric material liners is formed over the first semiconductor material portion and the second portion of the dielectric material layer. A portion of the dielectric stack is removed from the second device region. A second gate spacer is formed by anisotropically etching the second portion of the dielectric material layer while the dielectric stack masks the first semiconductor material portion.

According to another aspect of the present disclosure, a semiconductor structure includes a first gate structure straddling a first semiconductor material portion on a substrate, a second gate structure straddling a second semiconductor material portion on the substrate, first raised active regions located on the first semiconductor material portion, second raised active regions located on the second semiconductor material portion, a dielectric stack contacting the first raised active regions and the first gate structure, and not in physical contact with the second raised active regions, and a material layer including a dielectric material and in physical contact with the dielectric stack and surfaces of the second raised active regions.

DETAILED DESCRIPTION

As stated above, the present disclosure relates to complementary metal oxide semiconductor (CMOS) field effect transistors (FETs) including gate spacers of the same thickness and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first" and "second" are employed merely to distinguish similar elements, and different ordinals may be employed to designate a same element in the specification and/or claims.

Figure 1A:
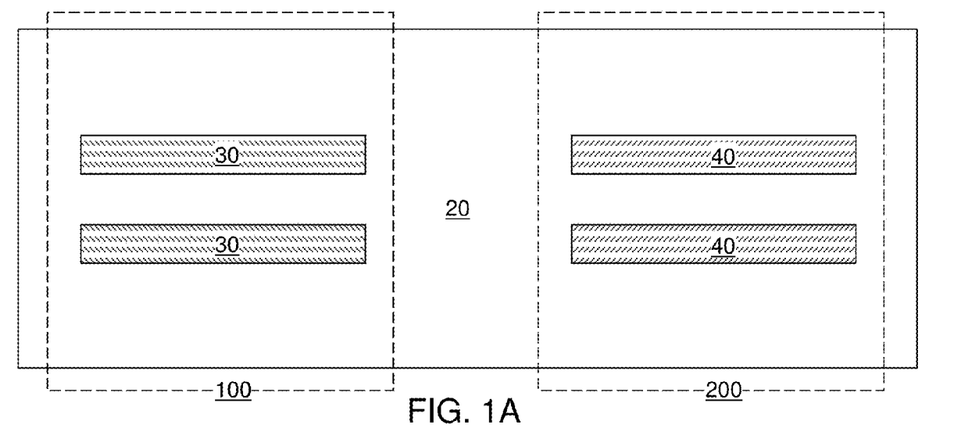
FIG. 1A is a top-down view of an exemplary semiconductor structure after formation of semiconductor fins by patterning a top semiconductor layer of a semiconductor-on-insulator (SOI) substrate according to an embodiment of the present disclosure.
Figure 1B:
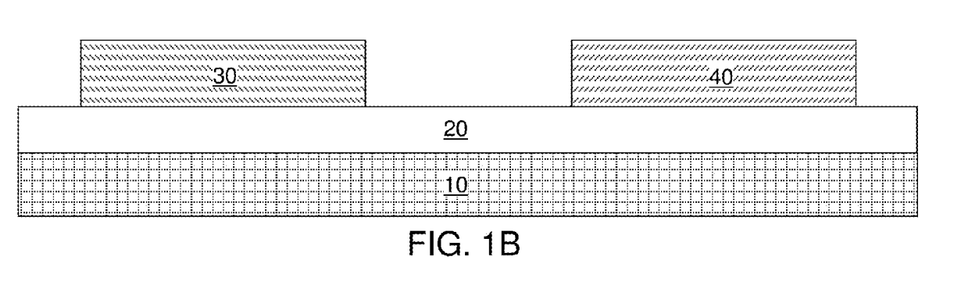
FIG. 1B is a vertical cross-sectional view of the exemplary semiconductor structure of FIG. 1A according to an embodiment of the present disclosure.

Referring to FIGS. 1A and 1B, an exemplary semiconductor structure according to an embodiment of the present disclosure includes semiconductor material portions (30, 40) provided on an insulator layer 20. A handle substrate 10 can be provided underneath the insulator layer 20 to provide mechanical support to the insulator layer 20 and the semiconductor material portions (30, 40). The handle substrate 10 can be a semiconductor layer, an insulator layer, or a conductive material layer. The insulator layer 20 includes an insulator material such as silicon oxide.

The semiconductor material portions (30, 40) can be formed by providing a semiconductor-on-insulator layer including, from bottom to top, the handle substrate 10, the insulator layer 20, and a top semiconductor layer, and subsequently patterning the top semiconductor layer. The top semiconductor layer can be patterned, for example, by application and lithographic patterning of a photoresist layer and subsequent pattern transfer into the top semiconductor layer employing an anisotropic etch. The photoresist layer can be removed, for example, by ashing.

At least one first semiconductor material portion 30 can be formed in a first device region 100, and at least one second semiconductor material portion 40 can be formed in a second device region 200. In one embodiment, the at least one first semiconductor material portion 30 can be at least one first semiconductor fin, and the at least one second semiconductor material portions 40 can be at least one second semiconductor fin. As used herein, a "semiconductor fin" refers to a semiconductor material portion having a parallel pair of vertical sidewalls that extend along a lengthwise direction. As used herein, a "lengthwise direction" of an element refers to a direction that is parallel to an axis of rotation of the element that passes through the center of mass and around which the moment of inertia is minimized.

The semiconductor material portions (30, 40) include at least one semiconductor material, which can be a Group IV semiconductor material, a compound semiconductor material, and/or an organic semiconductor material. Further, the at least one semiconductor material can be single crystalline, polycrystalline, or amorphous. In one embodiment, the semiconductor material portions (30, 40) include a single crystalline semiconductor material. The height of each semiconductor material portions (30, 40) can be in a range from 30 nm to 200 nm, although lesser and greater heights can also be employed. The width of each semiconductor material portion (30, 40) can be in a range from 10 nm to 100 nm, although lesser and greater widths can also be employed.

The first and second semiconductor material portions (30, 40) can be independently doped with p-type dopants and/or with n-type dopants. In one embodiment, the at least one first semiconductor material portion 30 can have a doping of a first conductivity type, and the at least one second semiconductor material portion 40 can have a doping of a second conductivity type that is the opposite of the first conductivity type. The first conductivity type can be p-type and the second conductivity type can be n-type, or vice versa.

Figure 2A:
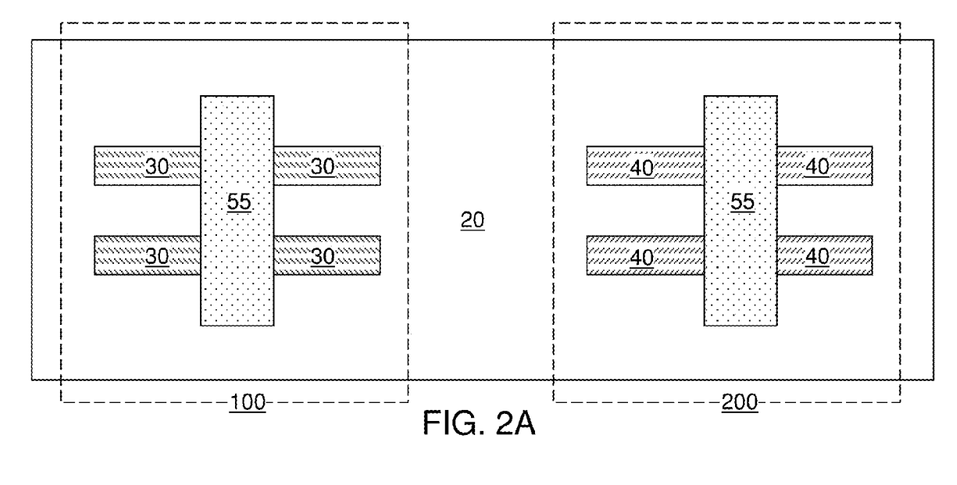
FIG. 2A is a top-down view of the exemplary semiconductor structure after formation of disposable gate structures according to an embodiment of the present disclosure.
Figure 2B:
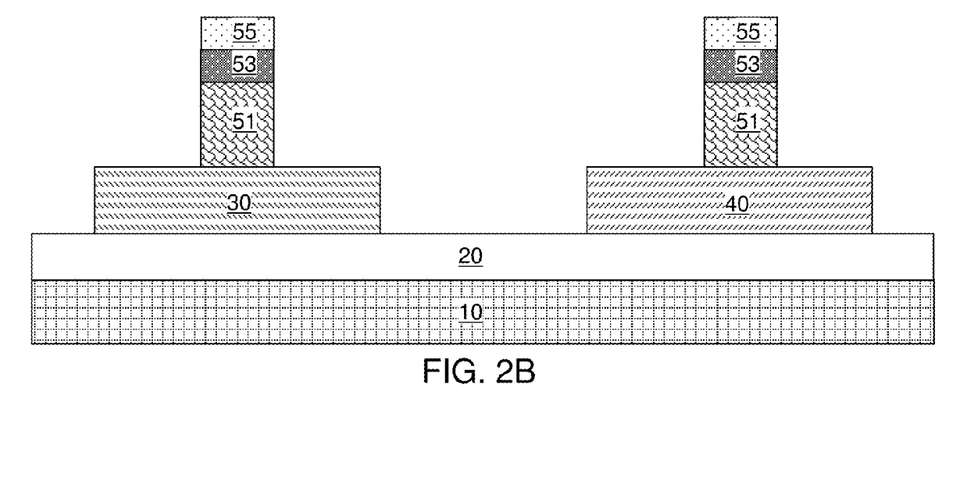
FIG. 2B is a vertical cross-sectional view of the exemplary semiconductor structure FIG. 2A according to an embodiment of the present disclosure.

Referring to FIGS. 2A and 2B, gate structures (51, 53, 55) can be formed across each of the semiconductor material portions (30, 40). The gate structures (51, 53, 55) can include a first gate structure (51, 53, 55) formed in the first device region 100 and a second gate structure (51, 53, 55) formed in the second device region 200. Thus, the first gate structure (51, 53, 55) straddles at least one first semiconductor material portion 30 in the first device region 100 on a substrate (10, 20), and the second gate structure (51, 53, 55) straddles the at least one second semiconductor material portion 40 in the second device region 200 on the substrate (10, 20).

In one embodiment, the gate structures (51, 53, 55) can be disposable gate structures, i.e., gate structures that can be subsequently removed. In one embodiment, the gate structures (51, 53, 55) can include a vertical stack of multiple material portions. For example, each gate structure (51, 53, 55) can include a vertical stack, from bottom to top, of a disposable material portion 51, a first dielectric cap 53, and a second dielectric cap 55. In one embodiment, the semiconductor material portions (30, 40) can include single crystalline silicon, the disposable material portions 51 can include germanium or a silicon germanium alloy in which the atomic concentration of germanium is greater than 50%, the first dielectric caps 53 can include silicon oxide, and the second dielectric caps 55 can include silicon nitride. The height of each gate structure (51, 53, 55), as measured from the topmost surfaces of the semiconductor material portions (30, 40), can be in a range from 100 nm to 400 nm, although lesser and greater thicknesses can also be employed.

While the present disclosure is described employing an embodiment in which the gate structures (51, 53, 55) are disposable structures, embodiments are expressly contemplated in which permanent gate structures are employed in lieu of disposable gate structures. In this case, each permanent gate structure include, from bottom to top, a gate dielectric and a gate electrode in lieu of a vertical stack, from bottom to top, of a disposable material portion 51, a first dielectric cap 53, and a second dielectric cap 55.

Figure 3A:
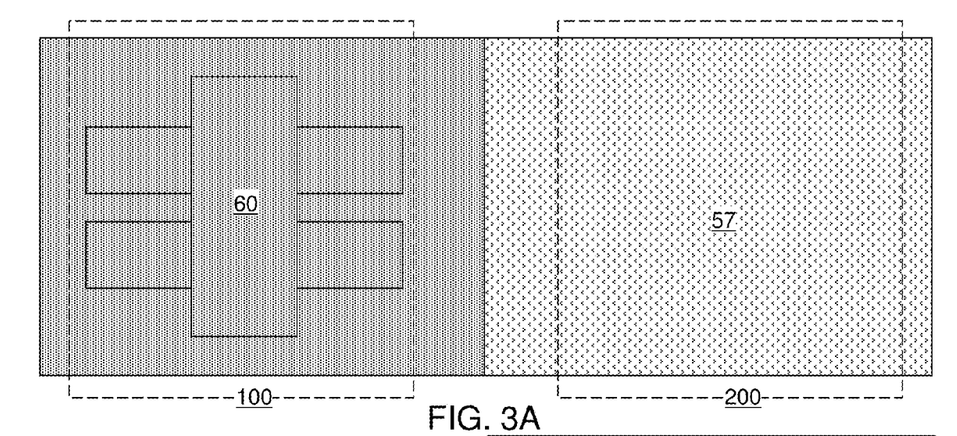
FIG. 3A is a top-down view of the exemplary semiconductor structure after formation of a dielectric material layer and a first patterned mask layer according to an embodiment of the present disclosure.
Figure 3B:
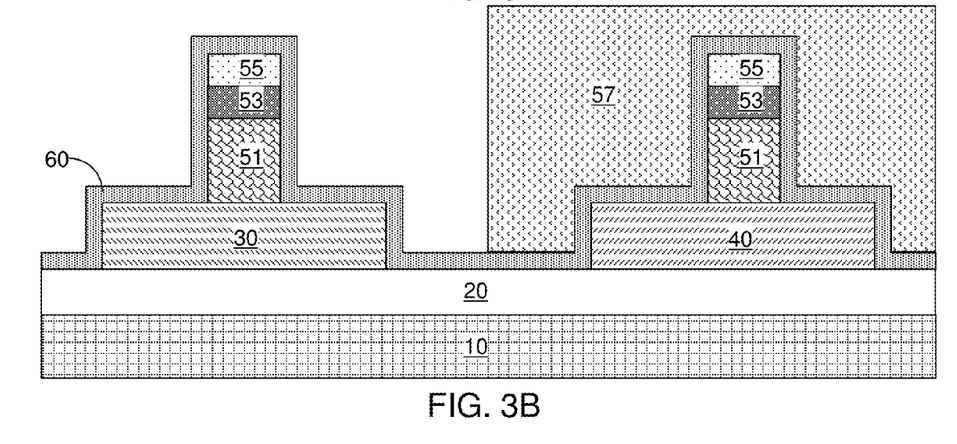
FIG. 3B is a vertical cross-sectional view of the exemplary semiconductor structure of FIG. 3A according to an embodiment of the present disclosure.

Referring to FIGS. 3A and 3B, a dielectric material layer 60 can be formed on physically exposed surfaces of the semiconductor material portions (30, 40) and the gate structures (51, 53, 55). The dielectric material layer 60 includes a dielectric material such as silicon nitride, silicon oxynitride, a dielectric metal oxide, a dielectric metal nitride, or a combination thereof. In one embodiment, the dielectric material layer 60 includes a dielectric material different from the dielectric material of the insulator layer 20. For example, the insulator layer 20 can include silicon oxide, and the dielectric material layer 60 can include a dielectric material different from silicon oxide.

The dielectric material layer 60 can be formed by a conformal deposition method such as chemical vapor deposition (CVD) or atomic layer deposition (ALD). In one embodiment, the dielectric material layer 60 can be formed by low pressure chemical vapor deposition (LPCVD). The thickness of the dielectric material layer 60 can be, for example, from 3 nm to 30 nm, although lesser and greater thicknesses can also be employed.

A first patterned mask layer 57 is formed over the second device region 200, while the first device region 100 is not covered by the first patterned mask layer 57. The first patterned mask layer 57 can be, for example, a patterned photoresist layer. In this case, a blanket photoresist layer can be formed in the first and second device regions (100, 200) over the semiconductor material portions (30, 40) and the gate structures (52, 53, 55), and can be lithographically patterned such that the remaining portion of the photoresist layer is present only in the second device region 200 and is not present in the first device region 100.

Figure 4A:
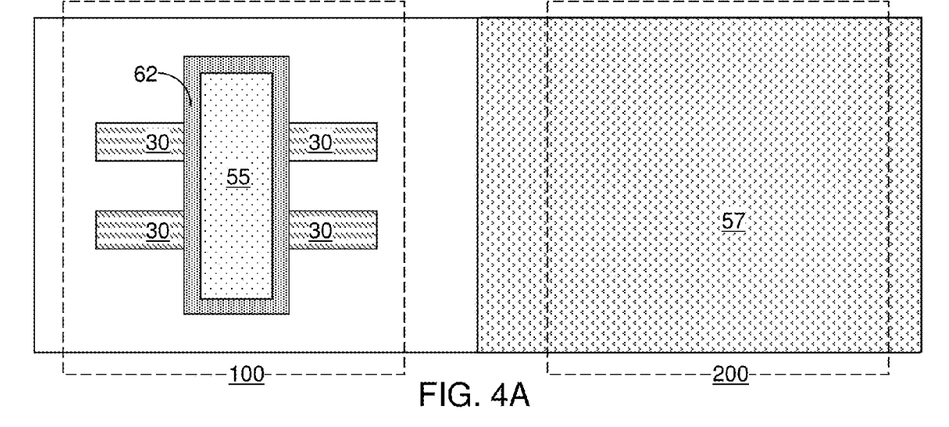
FIG. 4A is a top-down view of the exemplary semiconductor structure after formation of a first gate spacer and removal of the first patterned mask layer according to an embodiment of the present disclosure.
Figure 4B:
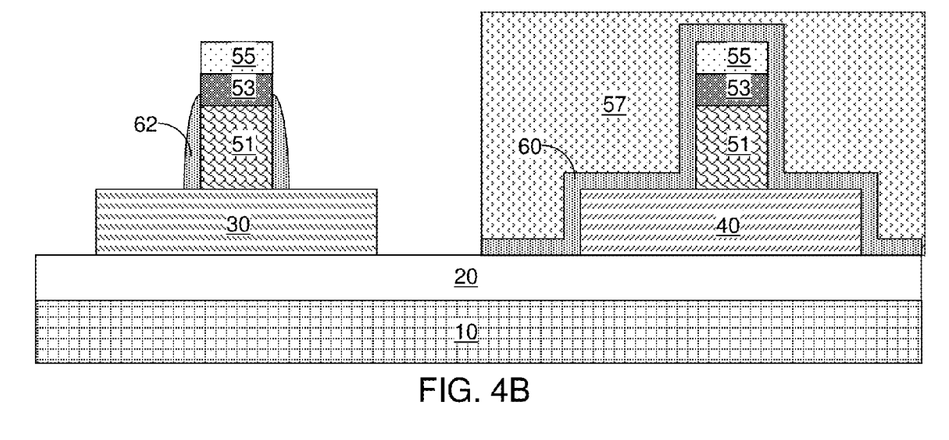
FIG. 4B is a vertical cross-sectional view of the exemplary semiconductor structure of FIG. 4A according to an embodiment of the present disclosure.

Referring to FIGS. 4A and 4B, an anisotropic etch is performed to remove horizontal portions of the physically exposed portions of the dielectric material layer 60 within the first device region 100, while the first patterned mask layer 57 covers the dielectric material layer 60 in the second device region 200. A contiguous remaining vertical portion of the dielectric material layer 60 laterally surrounding, and contacting, the first gate structure (51, 53, 55) in the first device region 100 constitutes a first gate spacer 62. Thus, the first gate spacer 62 can be formed by anisotropically etching a first portion of the dielectric material layer 60 in the first device region 100 while a second portion of the dielectric material layer 60 is masked in the second device region 200. The anisotropic etch can be, for example, a reactive ion etch. The first gate spacer 62 includes the same material as the dielectric material layer 60.

Figure 5A:
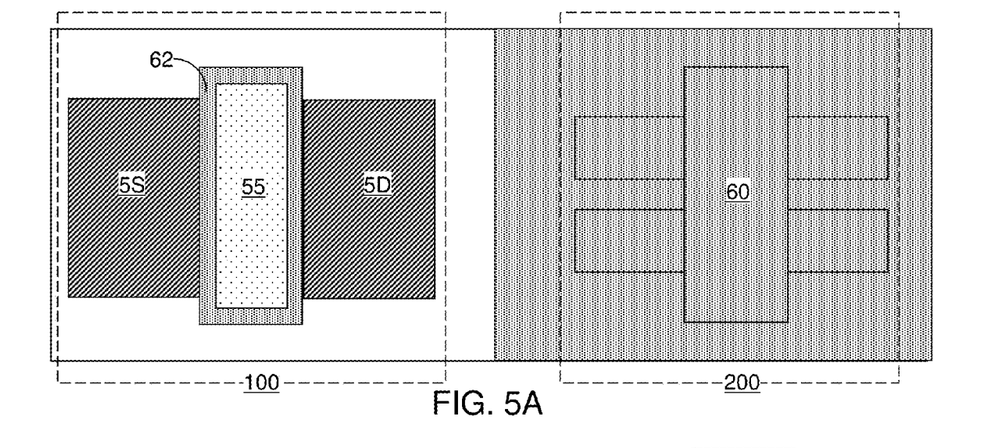
FIG. 5A is a top-down view of the exemplary semiconductor structure after formation of first raised active regions by a first selective epitaxy process according to an embodiment of the present disclosure.
Figure 5B:
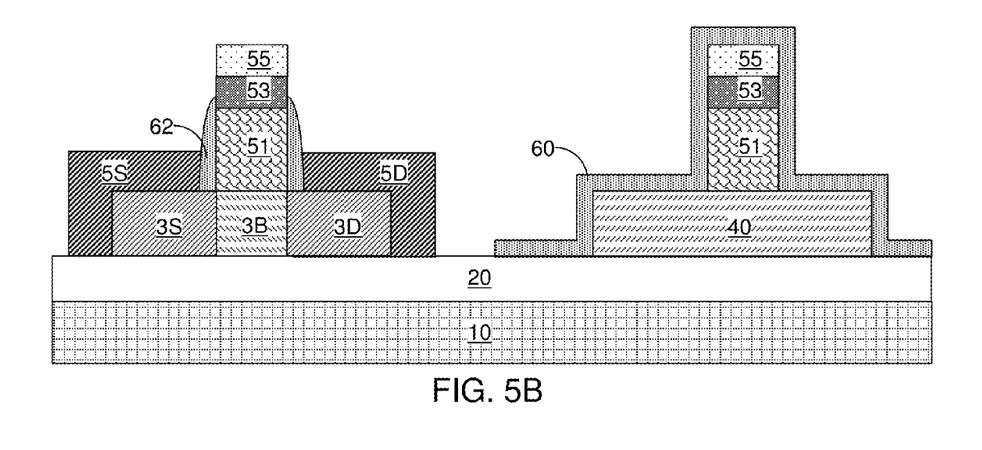
FIG. 5B is a vertical cross-sectional view of the exemplary semiconductor structure of FIG. 5A according to an embodiment of the present disclosure.

Referring to FIGS. 5A and 5B, first active regions (3S, 3D) can be formed by introducing electrical dopants into portions of the at least one first semiconductor material portions 30 that are not masked by the first gate structure (51, 53, 55) and the first gate spacer 62. As used herein, "active regions" collectively refer to a source region and a drain region of a field effect transistor. Each unimplanted portion of the at least one first semiconductor material portion 30 constitutes a first body region 3B, which contacts a first source region 3S and a first drain region 3D at p-n junctions. The first patterned mask layer 57 can be employed to prevent implantation of the electrical dopants into any portion of the at least one second semiconductor material portion 40.

The first patterned mask layer 57 can be removed selective to the dielectric material layer 60, the at least one first semiconductor material portion (3S, 3D, 3B), and the first gate structure (51, 53, 55), for example, by ashing. While the present disclosure is described employing an embodiment tin which the first active regions (3S, 3D) are formed after formation of the first gate spacer 62, embodiments in which the first active regions (3S, 3D) are formed prior to formation of the first gate spacer 62 are expressly contemplated herein.

First raised active regions (5S, 5D) can be formed by selective deposition of a semiconductor material on the surfaces of the first active regions (3S, 3D). During the selective deposition, the semiconductor material is deposited only on semiconductor surfaces, and does not nucleate on dielectric surfaces such as the surfaces of the dielectric material layer 60, the first gate spacer 62, and the first and second dielectric caps (53, 55). Thus, the first raised active regions (5S, 5D) can be formed on the at least one first semiconductor material portion (3S, 3D, 3B), while the second portion of the dielectric material layer 60 that remains in the second device region 200 masks the at least one second semiconductor material portion 40.

The first raised active regions (3S, 3D) can be deposited with in-situ doping of electrical dopants, or can be deposited as an intrinsic semiconductor material and subsequently doped with electrical dopants, for example, by a masked ion implantation process. The selective deposition can be performed, for example, employing a selective epitaxy process in which single crystalline semiconductor material portions are formed directly on the surfaces of the first active regions (3S, 3D). In this case, the first raised active regions (5S, 5D) can be epitaxially aligned to the at least one first semiconductor material portion (3S, 3D, 3B).

Figure 6A:
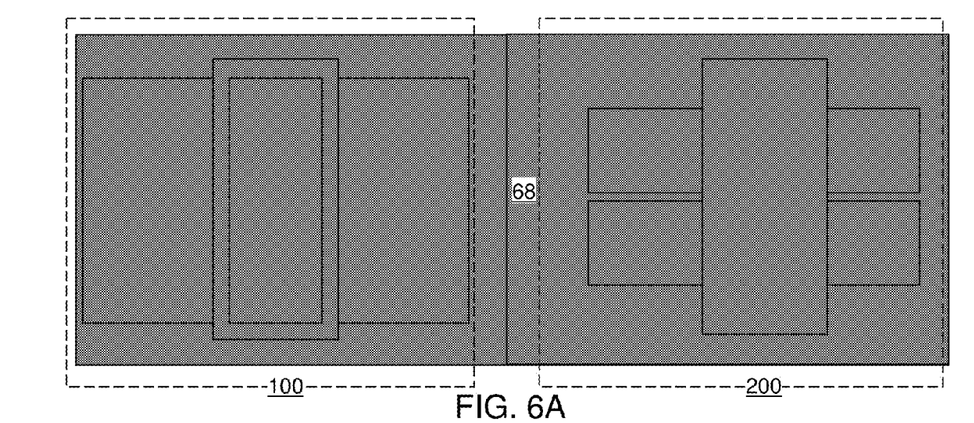
FIG. 6A is a top-down view of the exemplary semiconductor structure after formation of a dielectric stack of a dielectric oxide liner and a dielectric nitride liner according to an embodiment of the present disclosure.
Figure 6B:
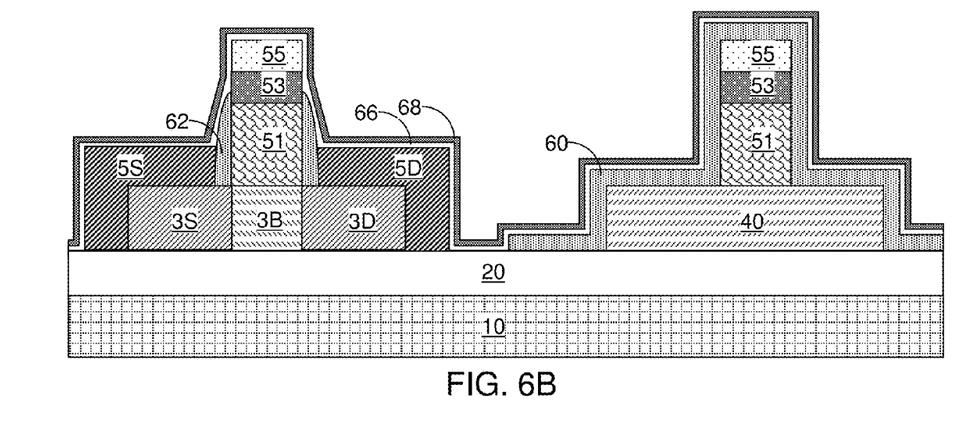
FIG. 6B is a vertical cross-sectional view of the exemplary semiconductor structure of FIG. 6A according to an embodiment of the present disclosure.

Referring to FIGS. 6A and 6B, a dielectric stack (66, 68) of a dielectric oxide liner 66 and a dielectric nitride liner 68 can be formed directly on physically exposed surfaces of the remaining portion of the dielectric material layer 60, the first raised active regions (5S, 5D), the first gate structure (51, 53, 55), the first gate spacer 62, and the insulator layer 20. The dielectric oxide liner 66 includes a dielectric oxide material such as silicon oxide. The dielectric nitride liner 68 includes a dielectric nitride material such as silicon nitride or a dielectric metal nitride. The dielectric oxide liner 66 and the dielectric nitride liner 68 can be deposited, for example, by chemical vapor deposition (CVD) or atomic layer deposition (ALD). The thickness of the dielectric oxide liner 66 can be in a range from 1 nm to 10 nm, although lesser and greater thicknesses can also be employed. The thickness of the dielectric nitride liner 68 can be in a range from 1 nm to 20 nm, although lesser and greater thicknesses can also be employed.

Figure 7A:
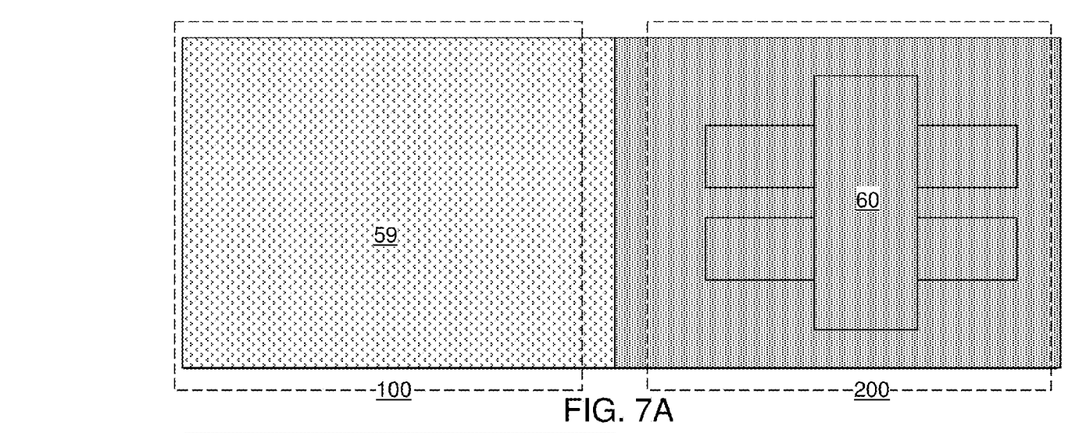
FIG. 7A is a top-down view of the exemplary semiconductor structure after formation of a second patterned mask layer and removal of physically exposed portions of the dielectric nitride liner according to an embodiment of the present disclosure.
Figure 7B:
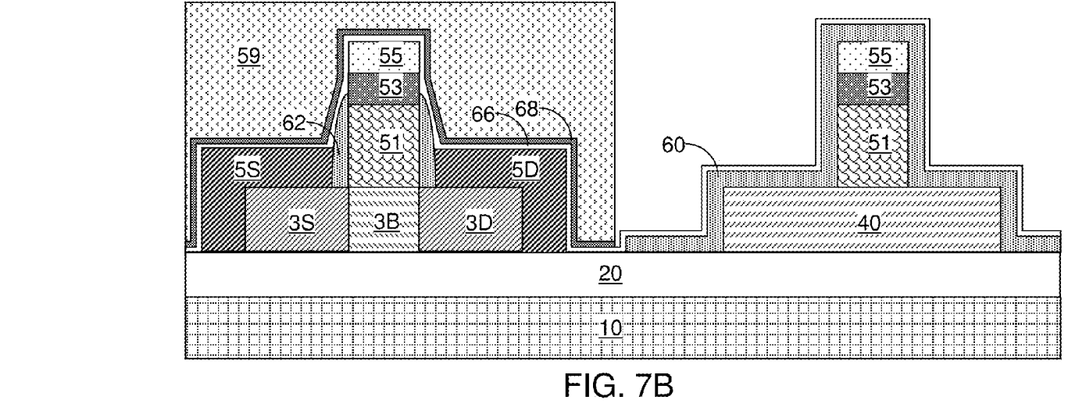
FIG. 7B is a vertical cross-sectional view of the exemplary semiconductor structure of FIG. 7A according to an embodiment of the present disclosure.

Referring to FIGS. 7A and 7B, a second patterned mask layer 59 is formed over the first device region 100, while the second device region 200 is not covered by the second patterned mask layer 59. The second patterned mask layer 59 can be, for example, a patterned photoresist layer. In this case, a blanket photoresist layer can be formed in the first and second device regions (100, 200) over the semiconductor material portions (30, 40), the first raised active regions (5S, 5D), the gate structures (52, 53, 55), and the remaining portions of the dielectric material layer 60, and can be lithographically patterned such that the remaining portion of the photoresist layer is present only in the first device region 100 and is not present in the second device region 200.

Physically exposed portions of the dielectric nitride liner 68 is removed employing the second patterned mask layer 59 as an etch mask. The dielectric nitride liner 68 can be removed from the second device region 200, for example, by an isotropic etch such as a wet etch or a chemical downstream etch (CDE). For example, if the dielectric nitride liner 68 includes silicon nitride, a wet etch employing a combination of ethylene glycol and hydrofluoric acid can be employed to remove the dielectric nitride liner 68. The duration of the isotropic etch can be timed such that the dielectric oxide liner 66 remains at least partially in the second device region 200 after the isotropic etch. Alternatively, an anisotropic etch can be employed in lieu of the isotropic etch provided that the anisotropic etch can remove the dielectric nitride liner 68 selective to the dielectric oxide liner 66.

Figure 8A:
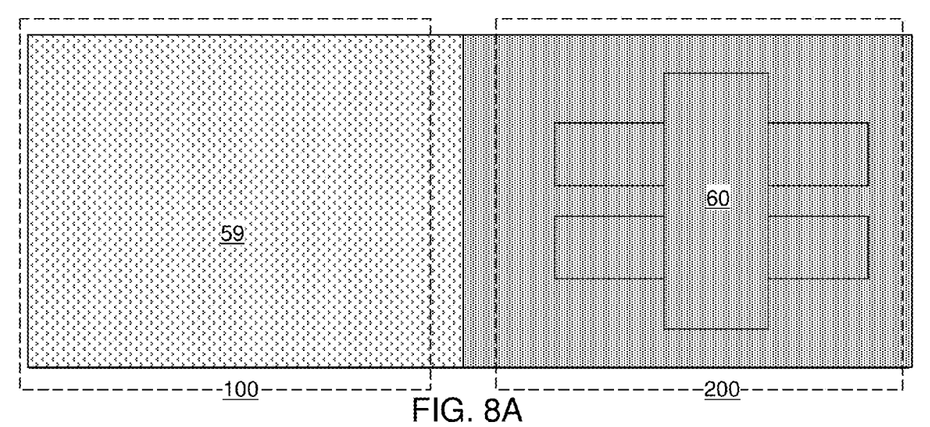
FIG. 8A is a top-down view of the exemplary semiconductor structure after removal of physically exposed portions of the dielectric oxide liner according to an embodiment of the present disclosure.
Figure 8B:
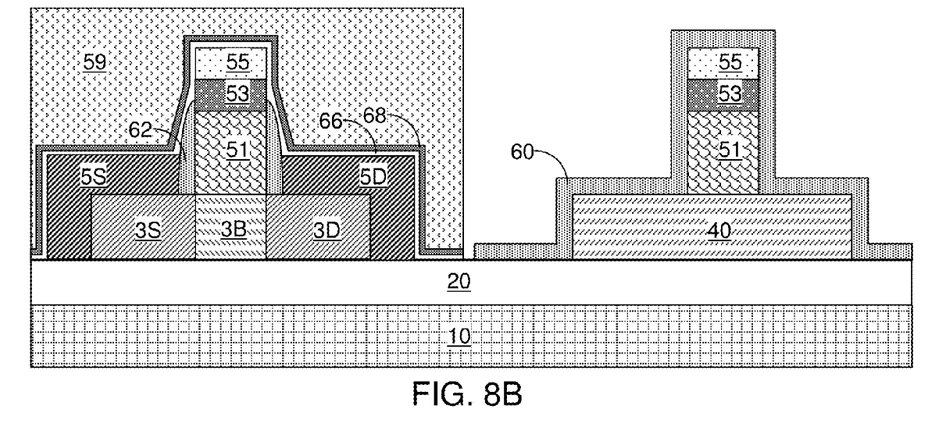
FIG. 8B is a vertical cross-sectional view of the exemplary semiconductor structure of FIG. 8A according to an embodiment of the present disclosure.

Referring to FIGS. 8A and 8B, the dielectric oxide liner 66 can be removed selective to the dielectric material layer 60 by another etch, which can be an isotropic etch such as a wet etch or a vapor etch. For example, if the dielectric oxide liner 6 includes silicon oxide, a wet etch employing hydrofluoric acid or a vapor etch employing a vapor of hydrofluoric acid can be employed to remove the dielectric oxide liner 66. The etch can be selective to the material of the dielectric material layer 60. Thus, the dielectric material layer 60 is not etched during removal of the dielectric oxide layer 66 from the second device region 200. Thus, the portion of the dielectric stack (66, 68) in the second device region 200 is removed employing the second patterned mask layer 59 as an etch mask.

Figure 9A:
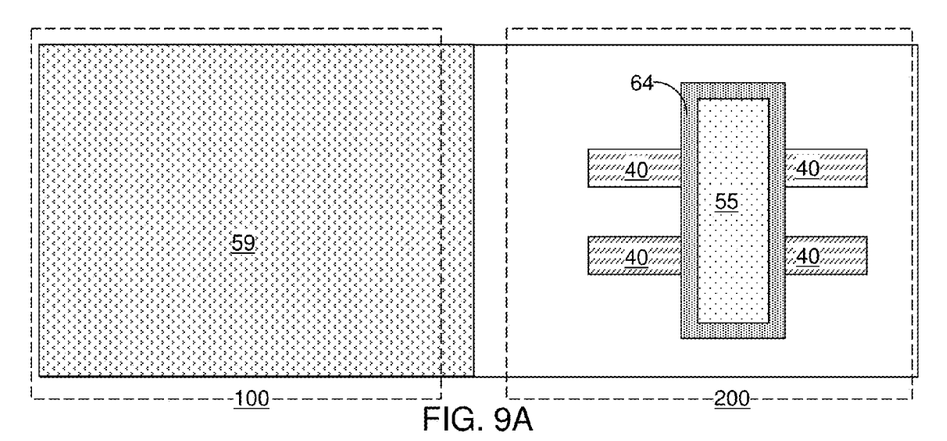
FIG. 9A is a top-down view of the exemplary semiconductor structure after formation of a second gate spacer by an anisotropic etch of a physically exposed portion of the dielectric material layer according to an embodiment of the present disclosure.
Figure 9B:
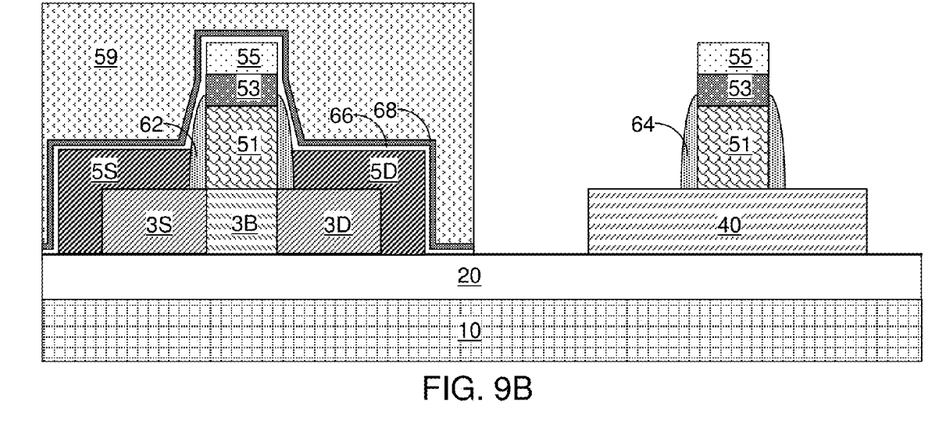
FIG. 9B is a vertical cross-sectional view of the exemplary semiconductor structure of FIG. 9A according to an embodiment of the present disclosure.

Referring to FIGS. 9A and 9B, an anisotropic etch is performed to remove horizontal portions of the physically exposed portions of the dielectric material layer 60 within the second device region 200, while the second patterned mask layer 59 covers the dielectric stack (66, 68) and the at least one first semiconductor material portion (3S, 3D, 3B) in the first device region 100. A contiguous remaining vertical portion of the dielectric material layer 60 laterally surrounding, and contacting, the second gate structure (51, 53, 55) in the second device region 200 constitutes a second gate spacer 64. Thus, the second gate spacer 64 can be formed by anisotropically etching the second portion of the dielectric material layer 60 in the second device region 200 while the dielectric stack (66, 68) is masked in the first device region 100. The anisotropic etch can be, for example, a reactive ion etch.

The second gate spacer 64 and the first gate spacer 62 include the same dielectric material, which is the material of the dielectric material layer. Further, the second gate spacer 64 has the same width as the first gate spacer 62. It is understood that the width of any gate spacer refers to the lateral dimension of the bottommost portions of the gate spacer. Thus, the width of the first gate spacer 62 is measured at the bottommost portion thereof, and that the width of the second gate spacer 64 is measured at the bottommost portion thereof.

Figure 10A:
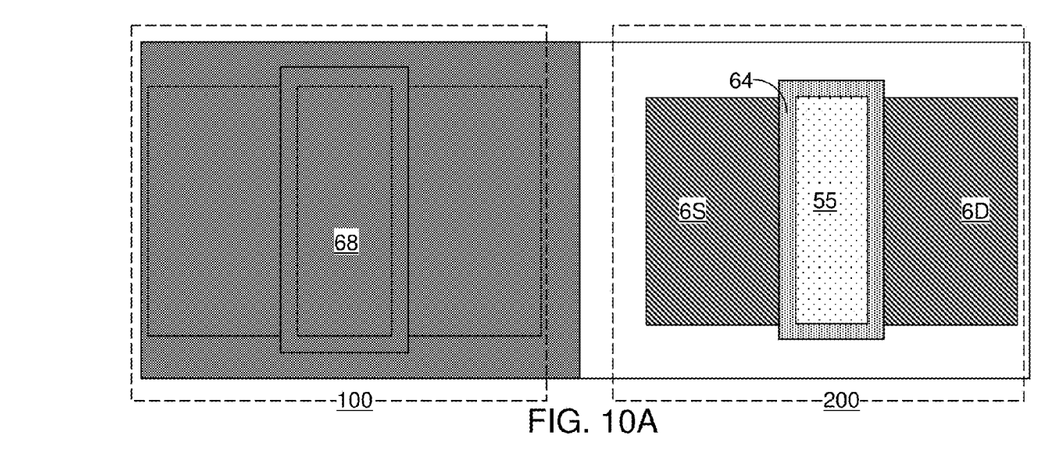
FIG. 10A is a top-down view of the exemplary semiconductor structure after formation of second raised active regions by a second selective epitaxy process according to an embodiment of the present disclosure.
Figure 10B:
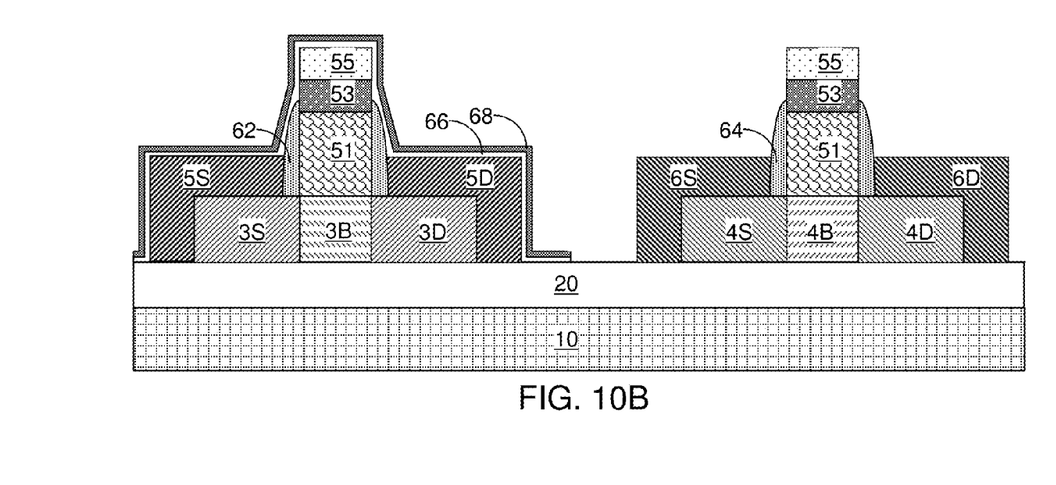
FIG. 10B is a vertical cross-sectional view of the exemplary semiconductor structure of FIG. 10A according to an embodiment of the present disclosure.

Referring to FIGS. 10A and 10B, second active regions (4S, 4D) can be formed by introducing electrical dopants into portions of the at least one second semiconductor material portions 40 that are not masked by the second gate structure (51, 53, 55) and the second gate spacer 64. Each unimplanted portion of the at least one second semiconductor material portion 40 constitutes a second body region 4B, which contacts a second source region 4S and a second drain region 4D at p-n junctions. The second patterned mask layer 59 can be employed to prevent implantation of the electrical dopants into any portion of the at least one first semiconductor material portion (3S, 3D, 3B).

The second patterned mask layer 59 can be removed selective to the dielectric stack (66, 68), the at least one second semiconductor material portion (4S, 4D, 4B), the second gate spacer 64, and the second gate structure (51, 53, 55), for example, by ashing. While the present disclosure is described employing an embodiment tin which the second active regions (4S, 4D) are formed after formation of the second gate spacer 64, embodiments in which the second active regions (4S, 4D) are formed prior to formation of the second gate spacer 64 are expressly contemplated herein.

Second raised active regions (6S, 6D) can be formed by selective deposition of a semiconductor material on the surfaces of the second active regions (4S, 4D). During the selective deposition, the semiconductor material is deposited only on semiconductor surfaces, and does not nucleate on dielectric surfaces such as the surfaces of the dielectric stack (66, 68), the second gate spacer 64, and the first and second dielectric caps (53, 55). Thus, the second raised active regions (6S, 6D) can be formed on the at least one second semiconductor material portion (4S, 4D, 4B), while the dielectric stack (66, 68) in the first device region 100 masks the at least one first semiconductor material portion (3S, 3D, 3B). The second raised active regions (6S, 6D) are formed after the portion of the dielectric stack (66, 68) in the second device region 200 is removed and while the portion of the dielectric stack (66, 68) in the first device region is present on the first raised active regions (5S, 5D).

The second raised active regions (4S, 4D) can be deposited with in-situ doping of electrical dopants, or can be deposited as an intrinsic semiconductor material and subsequently doped with electrical dopants, for example, by a masked ion implantation process. The selective deposition can be performed, for example, employing a selective epitaxy process in which single crystalline semiconductor material portions are formed directly on the surfaces of the second active regions (4S, 4D). In this case, the second raised active regions (6S, 6D) can be epitaxially aligned to the at least one second semiconductor material portion (4S, 4D, 4B).

Figure 11A:
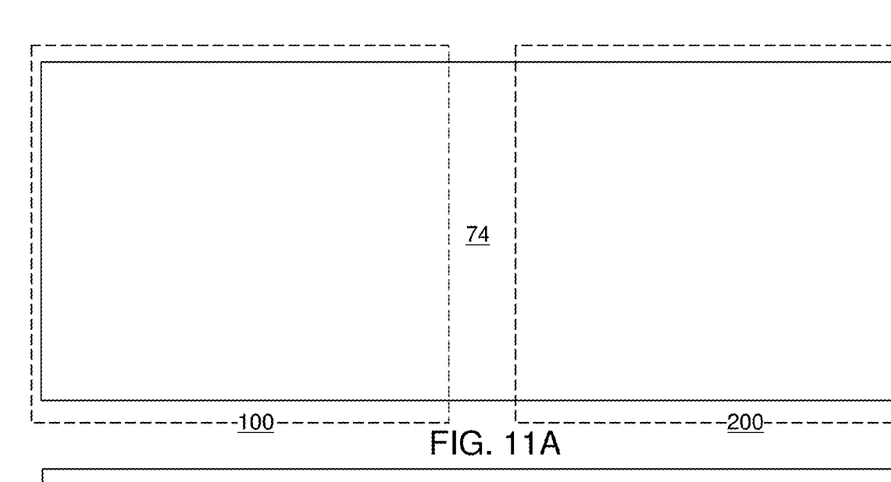
FIG. 11A is a top-down view of the exemplary semiconductor structure after formation of a diffusion barrier liner and a planarization dielectric layer according to an embodiment of the present disclosure.
Figure 11B:
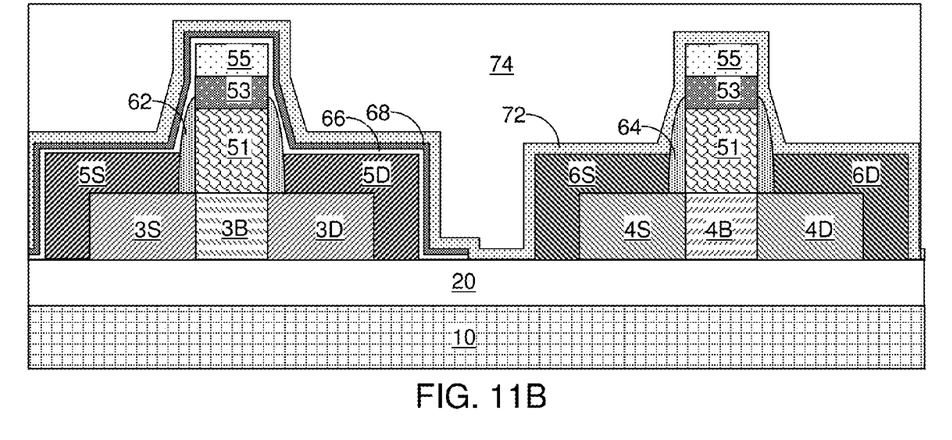
FIG. 11B is a vertical cross-sectional view of the exemplar semiconductor structure of FIG. 11A according to an embodiment of the present disclosure.

Referring to FIGS. 11A and 11B, a diffusion barrier layer 72 can be optionally formed on the top surfaces of the dielectric stack (66, 68), the insulator layer 20, the second raised active regions (6S, 6D), the second gate spacer 64, and the second gate stack (51, 53, 55). The diffusion barrier layer 72 includes an oxygen-impervious material. As used herein, an "oxygen-impervious material" refers to a material that provides molecular diffusivity for oxygen that is not greater than 10 times the diffusivity of thermal silicon nitride in a temperature range from 0° C. to 500° C. In one embodiment, the diffusion barrier layer 72 can include silicon nitride. The diffusion barrier layer 72 can be formed, for example, by chemical vapor deposition or atomic layer deposition. The diffusion barrier layer 72 can be conformal, i.e., can have the same thickness throughout. The thickness of the diffusion barrier layer 72 can be in a range from 3 nm to 60 nm, although lesser and greater thicknesses can also be employed.

A planarization dielectric layer 74 can be deposited over the over the first raised active regions (5S, 5D), the second raised active regions (6S, 6D), and the remaining portion of the dielectric stack (66, 68) that is present in the first device region 100. If a diffusion barrier layer 72 is present, the planarization dielectric layer 74 can be formed directly on the diffusion barrier layer 72. The planarization dielectric layer 74 can include undoped silicate glass, doped silicate glass, organosilicate glass (OSG), spin-on glass (SOG), or a combination thereof. The planarization dielectric layer 74 can be formed by chemical vapor deposition or spin-on coating. The planarization dielectric layer 74 can include a self-planarizing material, or can be subsequently planarized to provide a planar top surface.

Figure 12A:
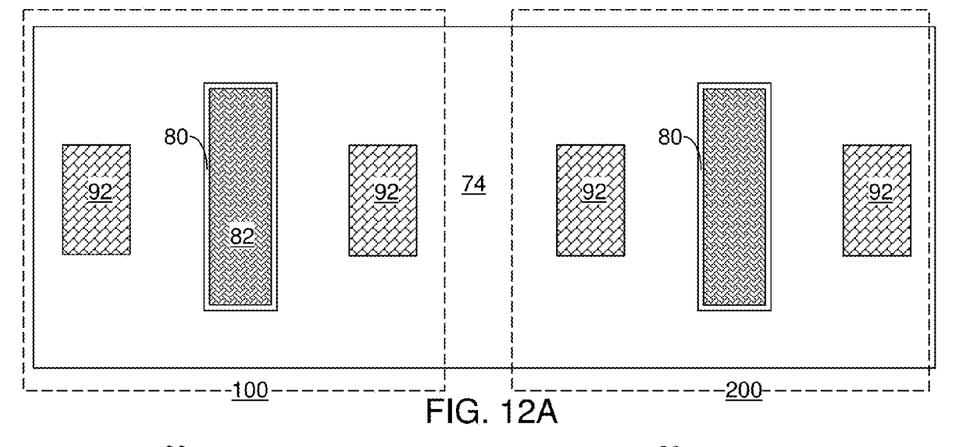
FIG. 12A is a top-down view of the exemplary semiconductor structure after formation of various contact via structures according to an embodiment of the present disclosure.
Figure 12B:
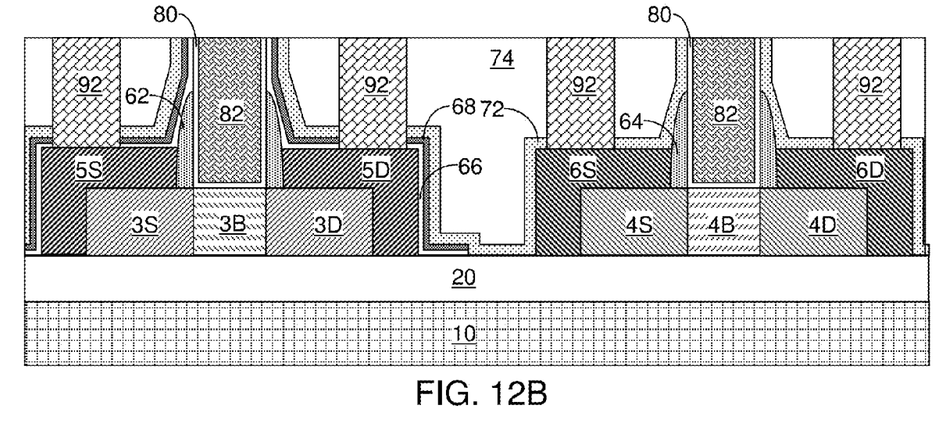
FIG. 12B is a vertical cross-sectional view of the exemplary semiconductor structure of FIG. 12A according to an embodiment of the present disclosure.

Referring to FIGS. 12A and 12B, in case the gate structures (51, 53, 55) are disposable gate structures, the planarization dielectric layer 74, the diffusion barrier layer 72, and the topmost portion of the dielectric stack (66, 68) can be removed from above the horizontal plane including the top surfaces of the gate structures (51, 53, 55) by a planarization process, a recess etch, or a combination thereof. The gate structures (51, 53, 55) can be removed selective to the planarization dielectric layer 74, the diffusion barrier layer 72, the dielectric stack (66, 68), the gate spacers (62, 64), and the semiconductor material portions (3S, 3D, 3B, 4S, 4D, 4B) to form gate cavities. A replacement gate structure (80, 82) can be formed in each gate cavity. Each replacement gate structure (80, 82) can include a gate dielectric 80 and a gate electrode 82. Various contact via structures 92 can be formed through the planarization dielectric layer 74, the diffusion barrier layer 72, and the dielectric stack (66, 68).

The exemplary semiconductor structure includes a first gate structure (80, 82 in the first device region 100) straddling at least one first semiconductor material portion (3S, 3D, 3B) on a substrate (10, 20), a second gate structure (80, 82 in the second device region 200) straddling at least one second semiconductor material portion (4S, 4D, 4B) on the substrate (10, 20), first raised active regions (5S, 5D) located on the at least one first semiconductor material portion (3S, 3D, 3B), second raised active regions (6S, 6D) located on the at least one second semiconductor material portion (4S, 4D, 4B), a dielectric stack (66, 78) contacting the first raised active regions (5S, 5D) and the first gate structure, and not in physical contact with the second raised active regions (6S, 6D), and a material layer (72 or 74) including a dielectric material and in physical contact with the dielectric stack (66, 68) and surfaces of the second raised active regions (6S, 6D). A first gate spacer 62 can laterally surround the first gate structure, and a second gate spacer 64 can laterally surround the second gate structure. The first gate spacer 62 and the second gate spacer 64 have the same composition and the same thickness as measured at the bottommost portions thereof. All outer sidewalls of the first gate spacer 52 can be in contact with one of the dielectric stack (66, 68) and the first raised active regions (5S, 5D). The dielectric oxide liner 66 can contact the first raised active regions (5S, 5D). All outer sidewalls of the second gate spacer 64 can be in contact with one of the material layer (72, 74) and the second raised active regions (6S, 6D).

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a first gate structure straddling a first semiconductor material portion in a first device region on a substrate and a second gate structure straddling a second semiconductor material portion in a second device region on said substrate;
    forming a dielectric material layer on said first and second gate structures;
    forming a first gate spacer by anisotropically etching a first portion of said dielectric material layer in said first device region while a second portion of said dielectric material layer is masked in said second device region;
    forming a dielectric stack including dielectric material liners over said first semiconductor material portion and said second portion of said dielectric material layer;
    removing a portion of said dielectric stack from said second device region; and
    forming a second gate spacer by anisotropically etching said second portion of said dielectric material layer while said dielectric stack masks said first semiconductor material portion.

2. The method of claim 1, wherein said dielectric material liners include a dielectric oxide liner and a dielectric nitride liner.

3. The method of claim 2, wherein said dielectric oxide liner includes silicon oxide.

4. The method of claim 1, further comprising:
    forming first raised active regions on said first semiconductor material portion while said second portion of said dielectric material layer masks said second semiconductor material portion; and
    forming second raised active regions on said second semiconductor material portion.

5. The method of claim 4, wherein said dielectric stack is formed directly on said first raised active regions.

6. The method of claim 4, wherein said second raised active regions are formed after said portion of said dielectric stack is removed from said second device region and while another portion of said dielectric stack is present in said first device region.

7. The method of claim 4, further comprising forming a planarization dielectric layer over said first raised active regions and said second raised active regions.

8. The method of claim 7, wherein said planarization dielectric layer is formed over a remaining portion of said dielectric stack that is present in said first device region.

9. The method of claim 8, further comprising forming a diffusion barrier layer comprising an oxygen-impervious material directly on said second raised active regions and said remaining portion of said dielectric stack, wherein said planarization dielectric layer is formed on said diffusion barrier layer.

10. The method of claim 1, wherein said first semiconductor material portion and said second semiconductor material portion are semiconductor fins.

11. The method of claim 10, wherein said semiconductor fins are formed by:
    providing a semiconductor-on-insulator substrate comprising a top semiconductor layer; and
    patterning said top semiconductor layer by lithography and an anisotropic etch.

12. The method of claim 11, further comprising introducing a dopant of a first conductivity type into said first semiconductor material portion, and introducing another dopant of a second conductivity type different from the first conductivity type into said second semiconductor material portion.

13. The method of claim 1, wherein said first gate structure and said second gate structures are disposable gate structures.

14. The method of claim 13, wherein said disposable gate structures are removed after forming said second gate spacer.

15. The method of claim 14, wherein said disposable gate structures are removed by a process comprising:
   forming a planarization dielectric layer having a topmost surface that is coplanar with a topmost surface of each disposable gate structure;
   etching the disposable gate structures to provide gate cavities; and
   forming a replacement gate structure in each of said gate cavities.

16. The method of claim 15, wherein said replacement gate structure comprises a gate dielectric and a gate electrode.

17. The method of claim 1, wherein said first gate structure and said second gate structure are permanent gate structures.

* * * * *